United States Patent
Tsai et al.

(10) Patent No.: US 9,305,662 B2
(45) Date of Patent: Apr. 5, 2016

(54) DATA STORAGE DEVICE AND FLASH MEMORY CONTROL METHOD

(71) Applicant: VIA TECHNOLOGIES, INC., New Taipei (TW)

(72) Inventors: Chin-Yin Tsai, New Taipei (TW); Yi-Lin Lai, New Taipei (TW)

(73) Assignee: VIA TECHNOLOGIES, INC., New Taipei (TW)

( * ) Notice: Subject to any disclaimer, the term of this patent is extended or adjusted under 35 U.S.C. 154(b) by 54 days.

(21) Appl. No.: 14/317,108

(22) Filed: Jun. 27, 2014

(65) Prior Publication Data

US 2015/0019925 A1     Jan. 15, 2015

Related U.S. Application Data

(60) Provisional application No. 61/845,065, filed on Jul. 11, 2013.

(30) Foreign Application Priority Data

Mar. 3, 2014   (TW) ............................... 103106958 A

(51) Int. Cl.
*G11C 29/00*       (2006.01)
*G11C 29/08*       (2006.01)
*G06F 12/02*       (2006.01)
(Continued)

(52) U.S. Cl.
CPC ............ *G11C 29/08* (2013.01); *G06F 12/0246* (2013.01); *G06F 12/1416* (2013.01); *G11C 16/349* (2013.01); *G11C 29/12015* (2013.01); *G06F 2212/7211* (2013.01); *G11C 16/00* (2013.01); *G11C 2029/0409* (2013.01); *G11C 2029/4402* (2013.01)

(58) Field of Classification Search
CPC ............ G06F 11/3058; G06F 11/3065; G06F 12/0246; G06F 12/1416; G06F 2212/7211; G11C 16/00; G11C 16/349
USPC ......................................................... 714/718
See application file for complete search history.

(56) References Cited

U.S. PATENT DOCUMENTS 5,195,100 A  *  3/1993 Katz ....................... G06F 11/08
                                                        714/22
8,583,859 B2 * 11/2013 Masuo ................ G06F 12/0246
                                                        711/103

(Continued)

FOREIGN PATENT DOCUMENTS

WO    WO 2010/080185          7/2010

*Primary Examiner* — David Ton
(74) *Attorney, Agent, or Firm* — McClure, Qualey & Rodack, LLP

(57) ABSTRACT

An identification technique for physically damaged blocks of a flash memory of a data storage device. In the data storage device, a controller coupled to the flash memory writes data into the flash memory with at least one time stamp corresponding to the data. The time stamp is taken into consideration by the controller to identify the physically damaged blocks of the flash memory, and thereby it is prevented from erroneously identifying a physically undamaged block as bad. Thus, the flash memory is prevented from being erroneously regarded as a write protected memory. The lifespan of the flash memory is effectively prolonged.

18 Claims, 2 Drawing Sheets

(51) Int. Cl.
*G11C 16/34* (2006.01)
*G11C 29/12* (2006.01)
*G06F 12/14* (2006.01)
*G11C 16/00* (2006.01)
*G11C 29/04* (2006.01)
*G11C 29/44* (2006.01)

(56) References Cited

U.S. PATENT DOCUMENTS

2005/0243626 A1\* 11/2005 Ronen .................. G11C 11/406
365/222
2007/0294496 A1\* 12/2007 Goss .................... G06F 12/1408
711/163

\* cited by examiner

DATA STORAGE DEVICE AND FLASH MEMORY CONTROL METHOD

CROSS REFERENCE TO RELATED APPLICATIONS

This application claims the benefit of U.S. Provisional Application No. 61/845,065 filed Jul. 11, 2013, the entirety of which is incorporated by reference herein.

This Application claims priority of Taiwan Patent Application No. 103106958, filed on Mar. 3, 2014, the entirety of which is incorporated by reference herein.

BACKGROUND OF THE INVENTION

1. Field of the Invention

The present invention relates to data storage devices with flash memory and flash memory control methods.

2. Description of the Related Art

Flash memory, a data storage medium, is common in today's data storage devices. For example, a flash memory is typically used in memory cards, USB flash devices, solid-state drives, and so on. In another application with multi-chip package technology, a NAND flash chip and a controller chip are combined in one package as an embedded MultiMediaCard (eMMC).

A flash memory provides a storage space which is divided into blocks, and each block includes a plurality of pages. An erase operation is performed on a block basis. To release the space of one block, the entire block has to be erased. The blocks with excessively high erase counts are typically marked as bad blocks which are run down and in bad condition. The more bad blocks, the fewer spare blocks available in the flash memory. When the number of spare blocks is less than a lower limit, the flash memory is write protected, readable but not writable.

BRIEF SUMMARY OF THE INVENTION

Data storage devices with flash memory and flash memory control methods are disclosed to provide accurate identification of physically damaged blocks.

A data storage device in accordance with an exemplary embodiment of the disclosure includes a flash memory and a controller coupled to the flash memory. The storage space of the flash memory is divided into a plurality of blocks. When storing data into the flash memory, the controller further stores at least one time stamp corresponding to the data into the flash memory. The controller determines whether one of the plurality of blocks for storage of the data is physically damaged by checking the time stamp corresponding to the data. The flash memory is prevented from being prematurely set to a write-protected status. Thus, the lifespan of the flash memory is effectively prolonged.

A flash memory control method in accordance with an exemplary embodiment of the disclosure includes the following steps: when storing data into the flash memory, further storing at least one time stamp corresponding to the data, the flash memory providing a storage space divided into blocks and each block including a plurality of pages; and determining whether one of the plurality of blocks for storage of the data is physically damaged by checking the time stamp corresponding to the data.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
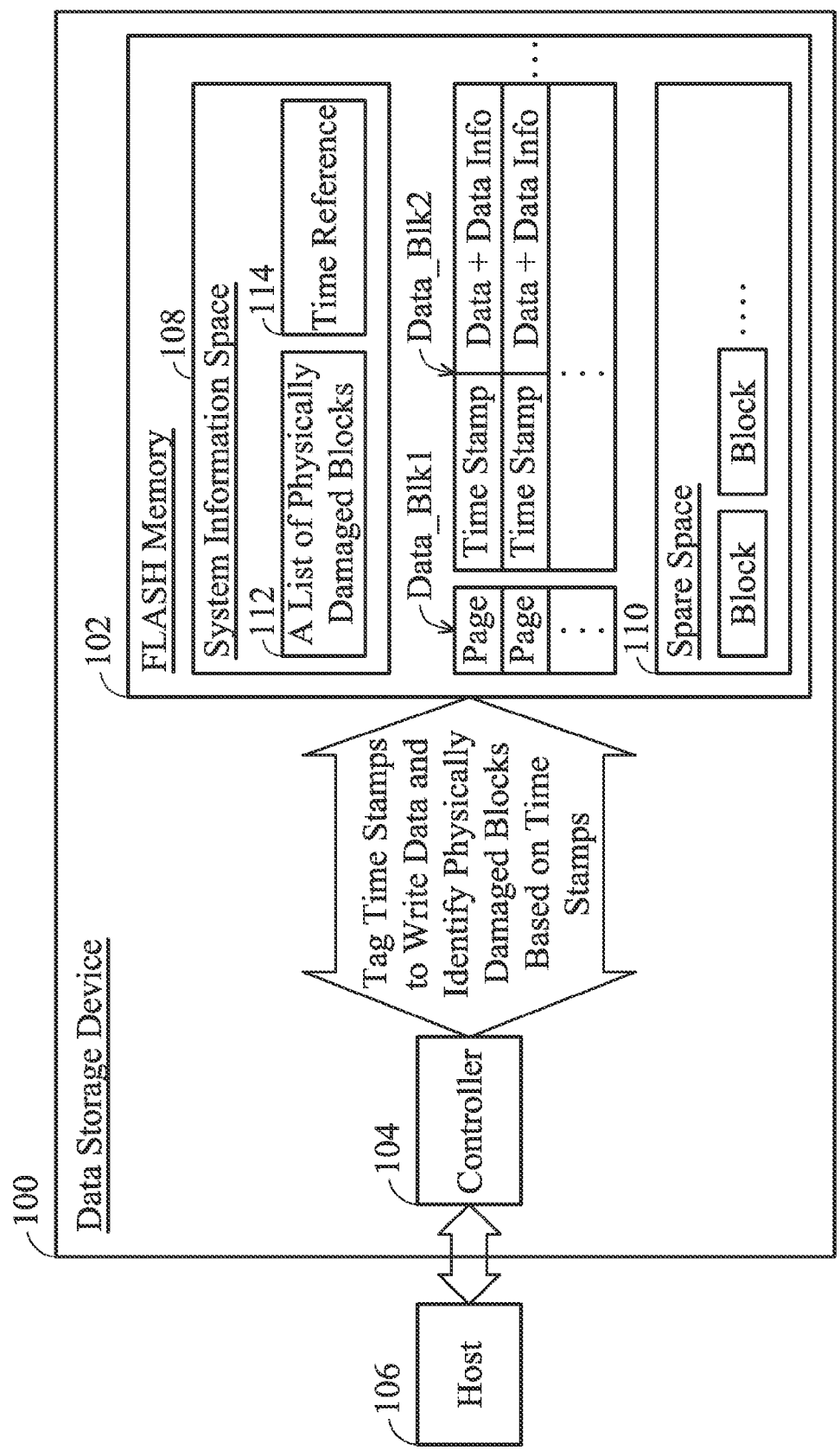
FIG. 1 depicts a data storage device 100 in accordance with an exemplary embodiment of the disclosure, which includes a flash memory 102 and a controller 104.

FIG. 1 depicts a data storage device 100 in accordance with an exemplary embodiment of the disclosure, which includes a flash memory 102 and a controller 104. The controller 104 may operate the flash memory 102 in accordance with requests issued from a host 106.

The flash memory 102 provides a storage space which is divided into blocks. Each block includes a plurality of pages. An erase operation is performed on a block basis. To release the space of a block, the block has to be entirely erased. Referring to the exemplary embodiment depicted in FIG. 1, some blocks of the flash memory 102 are allocated as a space 108 for system information, and the blocks Data_Blk1, Data_Blk2 . . . are allocated for user data storage, and the spare blocks form a spare space 110. The controller 104 uses the system information space 108 to record a list 112 of physically damaged blocks, to indicate the physically damaged blocks. The more physically damaged blocks, the fewer spare blocks are provided in the spare space 110. When the number of blocks contained in the spare space 110 is less than a lower limit, the entire flash memory 102 is write protected, readable but not writable.

According to the disclosure, the controller 104 is coupled to the flash memory 102. When storing data into the flash memory 102, the controller 104 further stores at least one time stamp corresponding to the data into the flash memory 102. The controller 104 determines whether a block for storage of the data is physically damaged by checking the time stamp corresponding to the data. In this manner, the blocks containing old data (rather than being physically damaged) are no longer erroneously marked as physically damaged blocks. The number of spare blocks within the flash memory 102 is no longer erroneously reduced. The flash memory 102 is protected from being prematurely switched to a write-protected status. The lifespan of the flash memory 102 is effectively prolonged.

Referring to data block Data_Blk2, according to the disclosure, the data in each page is tagged with a time stamp. Each physical page is stored with data and data information corresponding to the data as well as the time stamp tagged to the data. In an exemplary embodiment, the time stamp is stored in the header of each page. The time stamp may be presented by the standard time, showing the date or even the time of the data. In another exemplary embodiment, the time stamp just presents a power-on count of the system of the data storage device. The power-on count may show the number of power-on events of the data storage device 100. When writing data into the flash memory 102, the controller 104 may further write the power-on count of the system into the flash memory 102 as the time stamp corresponding to the data. The greater the difference between the system power-on count and the recorded time stamp, the older the data is.

Referring to the exemplary embodiment of FIG. 1, the controller 104 records a time reference 114 in the system information space 108 to show the current time of the system. The time reference 114 is arranged for judging the previously stored time stamps. The time reference 114 is compared with a time stamp to determine whether a block for storage of the data corresponding to the time stamp is physically damaged. Note that the controller 104 sets the time stamp tagging to the write data based on a current value of the time reference 114. In an exemplary embodiment, the standard time is filled into the flash memory 102 as the time reference 114. In another exemplary embodiment with reduced cost, the power-on count of the system is recorded as the time reference 114. In another exemplary embodiment, the data storage device 100 further includes a clock to replace the time reference 114.

In an exemplary embodiment, when there is a problem during a read operation for data contained in a space of the flash memory 102, the controller 104 checks whether a time stamp corresponding to the data contained in the space exceeds the time reference 114 by a threshold value, to determine whether the block(s) within the space for storage of the data is/are physically damaged. When the time stamp exceeds the time reference 114 by the threshold value, it is determined that the data contained in the space may be too old to be read out and the block(s) within the space is/are not regarded as physically damaged. And the problem during the read operation is occurred due to the data within in the space is too old to read rather than the physically damaged block(s) for storage of the data. When the time stamp does not exceed the time reference 114 by the threshold value, it is determined that the data contained in the space has not been stored in the space for a long time and the block(s) within the space may be determined as physically damaged. The space may just be part of a block, e.g., just some pages, or may contain multiple blocks. In an exemplary embodiment, a physical damage indicator is applied on a block basis. When any part of one block is physically damaged, the entire block may be marked as physically damaged.

Figure 2:
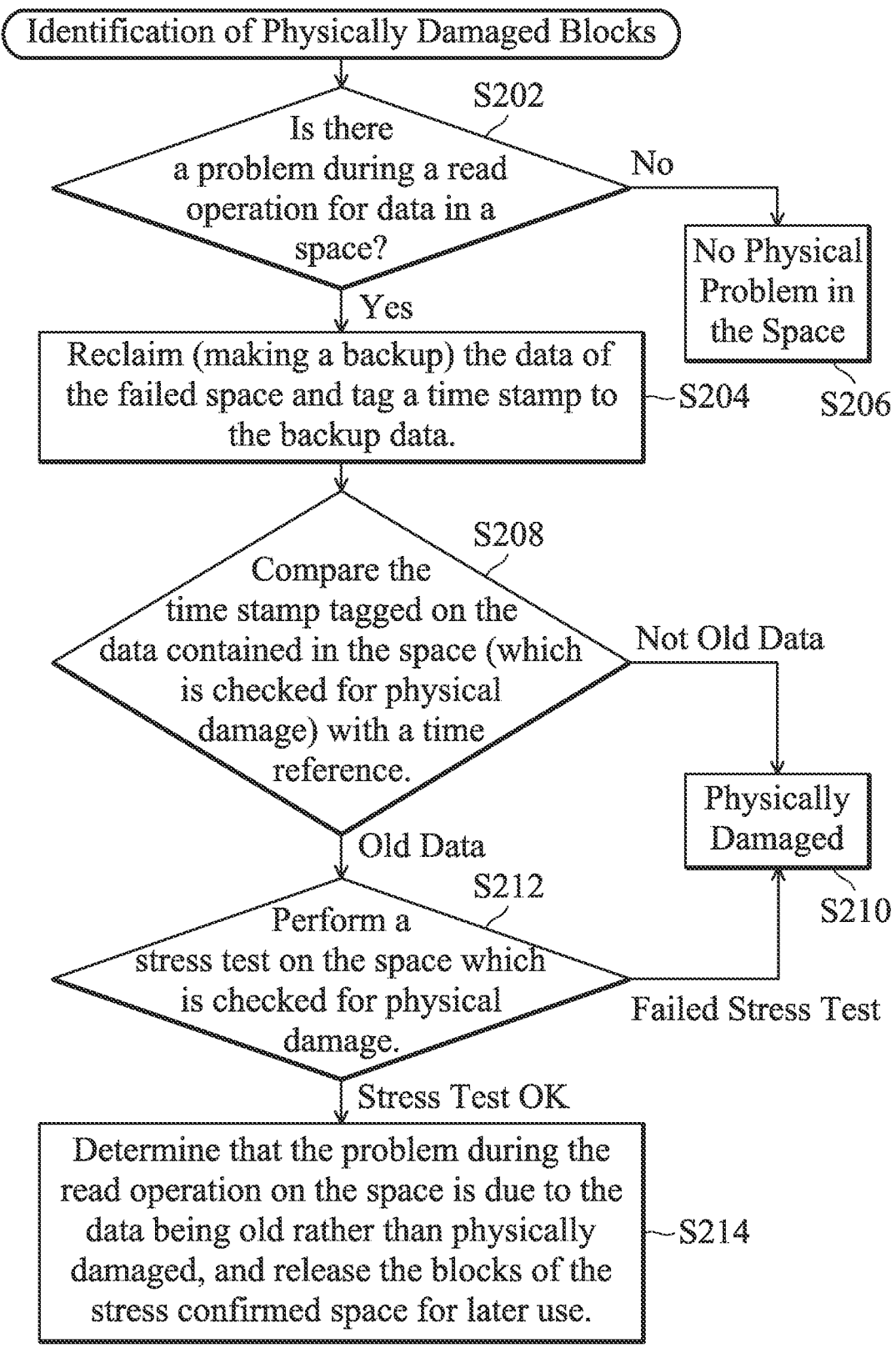
FIG. 2 is a flowchart depicting an identification method for physically damaged blocks within the flash memory 102.

FIG. 2 is a flowchart depicting an identification method for physically damaged blocks of the flash memory 102 in accordance with an exemplary embodiment of the disclosure. The identification method may be performed when reading data from the flash memory 102. In another exemplary embodiment, the flash memory 102 may be regularly (every time period) scanned for the identification of physically damaged blocks. In an exemplary embodiment, when writing data into the flash memory 102, at least one time stamp corresponding to the data is further stored into the flash memory 102 with the data. The storage space of the flash memory 102 is divided into a plurality of blocks. To determine whether a block storing the data is physically damaged, the time stamp corresponding to the data is checked. In detail, when there is a problem during a read operation for data in a space of the flash memory 102, it is determined whether the time stamp corresponding to the data stored in the space exceeds a time reference by a threshold value. Accordingly, it is determined whether the block(s) within the space is(are) physically damaged. This is discussed in the following paragraphs with respect to the steps of FIG. 2.

When it is determined in step S202 that there is a problem during a read operation for data contained in a space (e.g., data inaccessible, or data gained by repeated read operations), step S204 is performed to reclaim the data of the failed space (e.g., backup/copy the data to other block(s)). In some exemplary embodiments, a time stamp corresponding to the backup of the data synchronized with the time reference 114 of the system is tagged to the backup data. When it is determined in step S202 that the read operation works normally, step S206 is performed and it is determined that there is no physical problem in the space.

After step S204, step S208 is performed, in which the time stamp tagged on the data contained in the space which is checked for physical damage is compared with the time reference 114. When the time stamp corresponding to the data does not exceed the time reference 114 by a threshold value, it is determined that the data corresponding to the time stamp is not old data and step S210 is performed to mark the block(s) of the space as physically damaged. When the time stamp corresponding to the data exceeds the time reference 114 by the threshold value, it is determined that the data corresponding to the time stamp is old data and step S212 is performed as a stress test (i.e. stress confirmation) on the space. When it is determined in step S212 that the stress test on the space has failed, step S210 is performed to mark the block(s) of the space as physically damaged. Conversely, when it is determined in step S212 that the stress test on the space is ok, step S214 is performed to determine that the problem during the read operation on the space is due to the data being old rather than physically damaged. In step S214, the blocks of the stress confirmed space are released for later use.

An example of the stress test performed in step S212 is discussed in this paragraph. The block(s) within the space is/are entirely erased and then written with test data. When the test data is correctly read out, it is determined that the space has passed the stress test. On the contrary, it is determined that the stress test on the space fails.

The controller 104 may be a specially designed chip or be implanted by a computing unit and a read-only memory (ROM). The aforementioned technical steps may be performed by executing firmware codes stored in the ROM of a controller. The ROM code is executed by the computing unit of the controller. Any technique using the aforementioned concept to control a flash memory is within the scope of the invention. The invention further involves flash memory control methods, which are not limited to any specific controller architecture.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
   a flash memory, providing a storage space which is divided into a plurality of blocks; and
   a controller coupled to the flash memory, wherein when storing data into the flash memory, the controller further stores at least one time stamp corresponding to the data into the flash memory,
   wherein, the controller determines whether one of the plurality of blocks for storage of the data is physically damaged by checking the time stamp corresponding to the data.

2. The data storage device as claimed in claim 1, wherein:
   the controller further records a time reference in a system block between the plurality of blocks of the flash memory, the time reference being arranged to be compared with the time stamp corresponding to the data to determine whether the block for storage of the data is physically damaged; and when storing the data and the corresponding time stamp into the flash memory, the controller sets the value of the time stamp based on the time reference.

3. The data storage device as claimed in claim 1, wherein:
when there is a problem during a read operation for data in a space of the flash memory, the controller checks whether the time stamp corresponding to the data contained in the space exceeds a time reference by a threshold value to determine whether the block within the space for storage of the data is physically damaged.

4. The data storage device as claimed in claim 1, wherein:
when there is a problem during a read operation for data in a space of the flash memory, the controller makes a backup of the data contained in the space prior to checking whether the time stamp corresponding to the data contained in the space exceeds a time reference by a threshold value;
when determining that the time stamp corresponding to the data contained in the space does not exceed the time reference by the threshold value, the controller marks the block within the space as physically damaged;
when determining that the time stamp corresponding to the data contained in the space exceeds the time reference by the threshold value, the controller performs a stress test on the space;
when the space passes the stress test, the controller determines that the problem during the read operation is due to old data; and
when the stress test on the space fails, the controller marks the block within the space as physically damaged.

5. The data storage device as claimed in claim 4, wherein:
when making the backup of the data contained in the space, the controller tags the time stamp corresponding to the backup of the data synchronized to the time reference to the backup of the data.

6. The data storage device as claimed in claim 4, wherein:
when the space passes the stress test, the controller further releases the block within the space for later use.

7. The data storage device as claimed in claim 4, wherein:
when performing the stress test on the space, the controller entirely erases the block within the space and then writes test data into the block; and
the controller determines that the space passes the stress test when the test data is correctly read out; and
the controller determines that the stress test on the space fails when a read operation for the test data fails.

8. The data storage device as claimed in claim 1, wherein:
each block of the flash memory comprises a plurality of pages and each page is tagged with a time stamp.

9. The data storage device as claimed in claim 1, wherein:
the time stamp is stored in a header of a space of the flash memory storing the data.

10. The data storage device as claimed in claim 1, wherein:
the controller regularly scans the flash memory for identification of physically damaged blocks.

11. A flash memory control method, comprising:
when storing data into a flash memory, further storing at least one time stamp corresponding to the data into the flash memory, wherein the flash memory provides a storage space which is divided into a plurality of blocks; and
determining whether one of the plurality of blocks for storage of the data is physically damaged by checking the time stamp corresponding to the data.

12. The flash memory control method as claimed in claim 11, comprising:
when there is a problem during a read operation for data in a space of the flash memory, checking whether the time stamp corresponding to the data contained in the space exceeds a time reference by a threshold value to determine whether the block within the space is physically damaged.

13. The flash memory control method as claimed in claim 11, comprising:
when there is a problem during a read operation for data in a space of the flash memory, making a backup of the data contained in the space prior to checking whether the time stamp corresponding to the data contained in the space exceeds a time reference by a threshold value;
when determining that the time stamp corresponding to the data contained in the space does not exceed the time reference by the threshold value, marking the block within the space as physically damaged;
when determining that the time stamp corresponding to the data contained in the space exceeds the time reference by the threshold value, performing a stress test on the space;
when the space passes the stress test, determining that the problem during the read operation is due to old data; and
when the stress test on the space fails, marking the block within the space as physically damaged.

14. The flash memory control method as claimed in claim 13, comprising:
when making the backup of the data contained in the space, tagging the time stamp corresponding to the backup of the data synchronized to the time reference to the backup of the data.

15. The flash memory control method as claimed in claim 13, wherein:
when the space passes the stress test, the block within the space is released for later use.

16. The flash memory control method as claimed in claim 13, wherein:
when the stress test is performed on the space, the block within the space is entirely erased and then written with test data;
the space passes the stress test when the test data is correctly read out; and
the stress test on the space fails when a read operation on the test data fails.

17. The flash memory control method as claimed in claim 11, wherein:
each block of the flash memory comprises a plurality of pages and each page is tagged with a time stamp.

18. The flash memory control method as claimed in claim 11, comprising:
regularly scanning the flash memory for identification of physically damaged blocks.

* * * * *